n(12) United States Patent
Kho

(10) Patent No.: US 7,620,857 B2
(45) Date of Patent: Nov. 17, 2009

(54) CONTROLLABLE DELAY DEVICE

(75) Inventor: Rex Kho, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 407 days.

(21) Appl. No.: 11/382,231

(22) Filed: May 8, 2006

(65) Prior Publication Data

US 2006/0282714 A1 Dec. 14, 2006

(30) Foreign Application Priority Data

May 7, 2005 (DE) .................. 10 2005 020 903

(51) Int. Cl.
| | |
|---|---|
| G06K 5/04 | (2006.01) |
| G11B 5/00 | (2006.01) |
| G11B 20/20 | (2006.01) |
| H03L 7/06 | (2006.01) |
| H03L 7/00 | (2006.01) |
| H03H 11/26 | (2006.01) |
| H04B 3/46 | (2006.01) |
| H04B 17/00 | (2006.01) |
| H04Q 1/20 | (2006.01) |
| H04L 7/00 | (2006.01) |
| H04L 25/00 | (2006.01) |
| H04L 25/40 | (2006.01) |
| H03D 3/24 | (2006.01) |
| G04F 1/00 | (2006.01) |
| G04F 3/00 | (2006.01) |
| G04F 5/00 | (2006.01) |
| G04F 7/00 | (2006.01) |
| G04F 8/00 | (2006.01) |
| G04F 10/00 | (2006.01) |
| G04G 5/00 | (2006.01) |
| G04G 7/00 | (2006.01) |
| G04G 15/00 | (2006.01) |
| G06F 9/45 | (2006.01) |

(52) U.S. Cl. .................. 714/700; 327/161; 327/269; 327/262; 327/158; 327/277; 327/153; 375/371; 375/376; 375/226; 702/176; 702/177; 716/6; 716/10

(58) Field of Classification Search .................. None
See application file for complete search history.

(56) References Cited

U.S. PATENT DOCUMENTS 5,355,037 A 10/1994 Andresen et al.
5,570,383 A * 10/1996 Brown et al. .............. 714/815

(Continued)

FOREIGN PATENT DOCUMENTS

EP 0866555 9/1998

(Continued)

*Primary Examiner*—Kevin L Ellis
*Assistant Examiner*—Guerrier Merant
(74) *Attorney, Agent, or Firm*—Patterson & Sheridan, L.L.P.

(57) ABSTRACT

Two delay chains having in each case n series-connected unidirectional delay elements are provided for controllably delaying electrical signals between a circuit input and at least one circuit output. Each delay element is an active circuit with a fixed transit time. The input of the first delay element of the first chain is connected to the circuit input and the output of each delay element of the first delay chain is selectively connectable to the input of the $(n-i+1)$th delay element of the second delay chain via a respectively associated switch of a first group of switches, wherein $i=1 \ldots n$ is the ordinal number of the delay elements of the first delay chain. The output of the last delay element of the second chain is connected as a circuit output.

24 Claims, 3 Drawing Sheets

U.S. PATENT DOCUMENTS

| | | | | |
|---|---|---|---|---|
| 5,727,021 | A | * | 3/1998 | Truebenbach ............... 375/226 |
| 5,777,501 | A | | 7/1998 | AbouSeido |
| 2003/0182595 | A1 | * | 9/2003 | Carnevale et al. ............. 714/25 |
| 2005/0055614 | A1 | * | 3/2005 | Yeh ............................ 714/726 |
| 2005/0246596 | A1 | * | 11/2005 | Chen et al. .................. 714/700 |

FOREIGN PATENT DOCUMENTS

JP  200284170  3/2002

* cited by examiner

CONTROLLABLE DELAY DEVICE

CROSS-REFERENCE TO RELATED APPLICATIONS

This application claims foreign priority benefits under 35 U.S.C. §119 to co-pending German patent application number DE 10 2005 020 903.3, filed 7 May 2005. This related patent application is herein incorporated by reference in its entirety.

BACKGROUND OF THE INVENTION

1. Field of the Invention

The invention relates to a circuit arrangement for controllably delaying electrical signals. A preferred but not exclusive field of application of the invention is the controllable delay of clock signals in digital circuits.

2. Description of the Related Art

Controllable delay circuits are known and commonly used which contain a chain of a plurality of delay elements each having fixed (and in most cases equal) transit time and have a selection device which is connected to taps off of the chain in order to select a respective required tap and by this means to insert a required part-section of the chain between the circuit input and circuit output. The effective total delay between input and output is then equal to the sum of the transit times of the delay elements located in the selected part-section. The selection device usually contains, for each of the selectable taps, a selectively closable switching link which leads from the relevant tap to a common connection. In many known embodiments, this common connection is the input of the circuit where the signal to be delayed is applied (feed multiplex). In other embodiments, the common connection is the output where the delayed signal is taken off (take-off multiplex). Embodiments with two outputs are also known in order to obtain from one input signal two controllably delayed signals which are shifted in time with respect to one another by a fixed measure. In this arrangement, two selection devices are provided which are allocated in an interleaved manner to alternating taps of the same chain (in the case of feed multiplex) or each of which is allocated to a separate chain of two chains operated in parallel (in the case of take-off multiplex).

All these conventional embodiments have certain disadvantages which will be explained in greater detail in the text which follows by means of FIGS. 1 to 4 of the attached drawings.

FIG. 1 shows a known delay circuit with feed multiplex and a single output.

FIG. 2 shows a known delay circuit with take-off multiplex and a single output.

FIG. 3 shows a known delay circuit with feed multiplex and two outputs.

FIG. 4 shows a known delay circuit with take-off multiplex and two outputs.

In all figures, identical or similar elements are provided with in each case identical reference symbols in capital letters which are followed by a number or a lower-case letter as running number for closer identification. In the description following, the lower-case letter "i" is used as representative of an "arbitrary" number.

The known embodiment of a delay circuit, shown in FIG. 1, contains a chain K of a multiplicity n of similar delay elements A1 to An which are directly connected in series and each of which is an active (that is to say non-passive) and unidirectional circuit with a defined fixed transit time ("elementary delay") $\tau_E$. In the example shown, n=6. The definitions "unidirectional" and "active" mean that the element transmits signals only in one direction and acts as driver, in such a manner that the signal level does not significantly decrease when passing through the chain from element to element. Accordingly, the delay elements A1 . . . An in FIG. 1 (and also the delay elements in all other figures) are represented by the usual driver symbol in the form of a triangle, the point of which marks the output. If the signal to be delayed is a binary signal such as, e.g., a clock signal or a digital signal, two (or a greater even number of) series-connected inverters are in each case preferably used as delay elements A1 . . . An.

The input connection X of the delay circuit according to FIG. 1 is at the input side of the chain K, that is to say at the input of the first delay element A1. The chain K has at the output of each of the elements A1 . . . An a tap which can be selectively connected to an output connection Y. For this purpose, a total of n switching links SA1 . . . SAn are provided, in each case one for each of the taps at the outputs of the elements A1 . . . An. Each of these switching links can be made to conduct ("switched through") or blocked by an associated control signal. For the sake of illustration, the switching links are drawn symbolically like mechanical line switches. In reality, they are usually electronic switches, for example, in the form of field-effect transistors, preferably MOSFETs. In FIG. 1, a corresponding embodiment of the switch SA1 is shown in detail as representative of all switches SA1 . . . SAn which are all constructed in the same manner. The field-effect transistor FET shown forms the relevant switching link by means of the channel between the source diffusion region S and the drain diffusion region D. This link is blocked (non-conducting "0 state") if a binary control signal (0 or 1) applied to the gate G of the FET has a binary value "0" and conducting (switched-through "1 state") if the control signal has a binary value "1".

To operate the delay circuit according to FIG. 1, only a single one of the n switching links SA1 . . . SAn is switched through, the total delay $\tau_Y$ from the input connection X to the output connection Y being determined by the selection of the corresponding switching link. In general, it holds true for switching through the ith switching link SAi that the input signal passes through a number i of the delay elements (namely elements A1 . . . Ai) on its way from the input X to the output Y. In the ideal case, when the transit times via the respective connecting lines and switching links are negligibly small, the value $i*\tau_E$ is obtained for the total delay $\tau_Y$ (the symbol * stands for the operator of the multiplication here and in the text which follows). In practice, however, the problems described below can occur.

A first problem involves the line delays which, in practice, are frequently not negligible and therefore can lead to noticeable inaccuracies in the adjustment of the delay circuit. The time constant of these delays is the effective resistance of the switching link in each case switched through multiplied by the electrical capacity of the line length between the associated tap of the chain K and the circuit output. Since the signal to be delayed passes through different line lengths at different multiplexer settings, which is hard to avoid in the circuit arrangement according to FIG. 1, the contribution of the line delay to the total delay $\tau_Y$ differs from setting to setting. Thus, the total delay does not change linearly with the number of delay elements traversed from X to Y, i.e. the control characteristic ($\tau_Y$ as a function of i) is nonlinear which is undesirable for many applications. To produce linearity, the delay circuit must be aligned with great effort, for example by means of different trimming of the transit times of the various delay elements A1 . . . An within the chain K or by inserting and trimming additional delay elements in the line system. This can only be done by means of measurements on the completed delay circuit.

A second problem is the total load which must be driven by the associated delay element Ai via the switching link SAi switched through in each case. Apart from the external output load at the output connection Y, this total load contains a number of internal load components, namely, firstly, the input impedance of the delay element Ai+1 following, secondly the parasitic capacitances of the switching link SAi switched through, thirdly the electrical capacity of the entire line system between the switching links SA1 . . . SAn and the output connection Y and fourthly all parasitic capacitances which are effective at the ends of all other switching links (not switched through) connected to this line system. When field-effect transistors are used, the above-mentioned parasitic switch capacitances are mainly the capacitance $C_{SB}$ between source diffusion region S and bulk B (substrate) and the capacitance $C_{DB}$ between drain diffusion region D and bulk B. These capacitances are drawn in at the FET shown in FIG. 1.

Naturally, the total load described increases with the length of the delay chain K, i.e. with the number n of delay elements. At some point, the load becomes too great for an individual delay element Ai so that the maximum chain length must be limited. This is of disadvantage because, as a result, the maximum delay which can be set is restricted. One way out is to subdivide the chain into a number of sections, each of which operates into a separate multiplexer which are then brought together in a tree circuit, in each case by interposing an amplifier via one or more further multiplexer levels. Apart from the high circuit expenditure, this stepped multiplexing has the further disadvantage that the stepping itself introduces additional line delay which has the result that the minimum value of the adjustable delay is relatively great. Furthermore, this additional delay is not a linear function of the number of delay elements traversed. This additionally increases the above-mentioned adjustment effort for linearizing the control characteristic.

Similar problems arise if the delay circuit is designed for operation with feed multiplex as shown in FIG. 2. In this arrangement, before each delay element Ai in the delay chain K, a switch SAi is provided which can be selectively operated in order to connect the input of the relevant delay element to the input connection X. When such a connection is established, the output of the preceding delay element A(i−1) in the chain should be effectively decoupled from the input connection X. This can be achieved, for example, by constructing the switches as change-over switches (2:1 multiplexers) as is illustrated by corresponding switch symbols in FIG. 2. Each switch SAi can be switched between two states by a binary control signal (0/1) in order to connect the input of the relevant delay element Ai either to the input connection X via a connection "1" ("1 state" of the switch) or in order to connect the input of the relevant delay element Ai to the output of the preceding delay element A(i−1) via a connection "0" ("0 state" of the switch). The "0" connection of the switch SA1 preceding the first delay element A1 remains unused.

The switches SA1 . . . SAn in the delay circuit according to FIG. 2 also have parasitic capacitances which are effective at their connections. These switches can also be formed by FETs as is shown in detail for the switch SA2 in FIG. 2 as representative of all switches SA1 . . . SAn which are all constructed in the same manner. The channel of a field-effect transistor FET1 forms the switching link from the "1" connection to the input of the subsequent delay element and is switched through when a binary control signal has the binary value "1". The channel of a field-effect transistor FET0 forms the switching link from the "0" connection to the input of the subsequent delay element and is switched through when a binary control signal has the binary value "0".

In the operation of the circuit according to FIG. 2, only a single one of the switches SA1 . . . SAn is set into the 1 state. The signal to be delayed then passes from the input connection X to the input of the associated delay element and then passes through the rest of the chain K to the output connection Y which is located at the output of the last delay element An and where the signal can be taken off with a delay of (n−i+1)*$\tau_E$.

The input signal must here work into a load which is composed of the sum of the parasitic capacitances at the "1" connections of the switches SA1 . . . SAn and the impedance of the entire line system between the input connection X and these switches. As the chain is very long, this requires a driver with enormous power. In many environments, such a driver is not practicable so that, in practice, the maximum length of the chain must be limited. With regard to the line delays, the same problems arise as in the circuit arrangement according to FIG. 1.

As has already been indicated, it is also known to extend controllable delay circuits of the type described above in such a manner that two versions of the input signal displaced with respect to one another by a fixed time scale can be taken off at two output connections, namely an "early" version of controllable delay time and a "late" version which appears later than the early version by the fixed time scale $\tau_E$. Such delay circuits are used in, among other things, DLL (delay locked loops), particularly for regulating the time displacement of a binary clock signal. Such a clock signal usually consists of a pulse sequence, the rising or falling edges of which in each case determine the clock cycle when a predetermined threshold value is reached. By means of weighted superimposition of the late version of a clock edge, delayed by $\tau_E$, on the early version of this edge in a suitable mixer, a resultant clock edge can be obtained which reaches the threshold value at a time within the time interval between early and late version, this time being controllable by controlling the relative weighting in the mixer.

FIG. 3 shows a first known embodiment of a controllable delay circuit for supplying the above-mentioned early and late versions of a clock signal at the input end. This circuit operates with take-off multiplex and differs from the circuit according to FIG. 1 in that, instead of a single output connection Y, two output connections Ya and Yb are provided. The taps of the delay chain K at the outputs of each second delay element A2, A4, . . . (all even-numbered elements) lead to the second output connection Yb via associated switching links SAb1, SAb2, . . . and the taps at the outputs of the other delay elements A1, A3, . . . (all odd-numbered elements) lead to the output connection Ya via associated switching links SAa1, SAa2, . . . . Selective switching-through of, in each case, one pair of switches SAai, SAbi has the result that the clock signal applied at the input connection X appears as "late" clock with a delay of 2i*$\tau_E$ at the output connection Yb and as "early" clock with a delay of (2i−1)*$\tau_E$, less by $\tau_E$, at the output connection Ya.

FIG. 4 shows an alternative known embodiment of a controllable delay circuit for supplying early and late versions of a clock signal at the input end. This circuit operates with feed multiplex similar to the circuit of FIG. 2 but contains two delay chains Ka and Kb, each of which leads to a separate output connection Ya and Yb, respectively. The chain Kb contains n delay elements B1 . . . Bn, the inputs of the elements B1, B3, . . . (that is to say all odd-numbered elements) being selectively connectable to the input connection X via associated switches SB1, SB2, .... The chain Ka contains n−1 delay elements A1 ... A(n−1), the inputs of the elements A1, A3, ... (that is to say all odd-numbered elements) being selectively connectable to the input connection X via associated switches SA1, SA2, .... The selective switching of in each case one pair of switches SBi, SAi into the 1 state has the result that the clock signal applied at input connection X appears as "late" clock with a delay $(n-2i+2)*\tau_E$ at the output connection Yb and as "early" clock with a delay $(n-2i+1)*\tau_E$, less by $1\tau_E$, at the output connection Ya.

In the known early/late delay circuits according to FIGS. 3 and 4, the same results are obtained as have been described above for the known circuits according to FIGS. 1 and 2. That is to say, in the conventional art, the loads on individual circuit sections and also the inaccuracies of the delays set in each case increase with the length of the delay chains. In the variant of FIG. 4, an additional further disadvantage is that a relatively large number of delay elements is needed; a control range of the delay from $1\tau_E$ to $n*\tau_E$ requires a total of $2*n-1$ delay elements.

Therefore, there is a demand for a controllable delay circuit operating with tapped delay chain, in such a manner that the maximum load on the circuit elements needed for the operation is less than in the conventional art and independent of the chain length.

SUMMARY OF THE INVENTION

According to a first aspect of the invention, a circuit arrangement for controllably delaying electrical signals between a circuit input and at least one circuit output comprises a first delay chain having n series-connected unidirectional delay elements, each of which is an active circuit with a fixed transit time, the input of the first delay element being connected to the circuit input and the output of each delay element being selectively connectable to a forwarding circuit leading to a first circuit output via an individually associated switch of a first group of switches. The forwarding circuit has a second delay chain leading to the first circuit output and containing n series-connected unidirectional delay elements, each of which is an active circuit with a fixed transit time. The output of each delay element of the first delay chain is selectively connectable to the input of the (n−i+1)th delay element of the second delay chain via the in each case associated switch of the first group of switches, i=1 ... n being the ordinal number of the delay elements of the first delay chain.

According to another aspect of the invention, a circuit arrangement for controllably delaying electrical signals between a circuit input and a first and a second circuit output comprises a first delay chain having n series-connected unidirectional delay elements, a second delay chain having n series-connected unidirectional delay elements and a third delay chain having n+1 series-connected unidirectional delay elements. Each of the delay elements of the first, second and third delay chains is an active circuit with a fixed transit time and having an input and an output. The input of the first delay element of the first delay chain is connected to the circuit input. The output of the n-th delay element of the second delay chain is connected to the first circuit output. The output of the (n+1)-th delay element of the third delay chain is connected to the second circuit output. The output of the i-th delay element of the first delay chain is selectively connected to the input of the (n−i+1)-th delay element of the second delay chain via an associated switch of a first group of switches. The output of the i-th delay element of the first delay chain is selectively connected to the input of the (n−i+1)-th delay element of the third delay chain via an associated switch of a second group of switches. The input of the (n+1)-th delay element of the third delay chain is connected to the circuit input via an associated switch of the second group of switches. i=1 ... n is the ordinal number of the delay elements of the first, second and third delay chains.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In the text which follows, exemplary embodiments will be described for explaining the invention in greater detail, referring to FIGS. 5 and 6.

Figure 1:
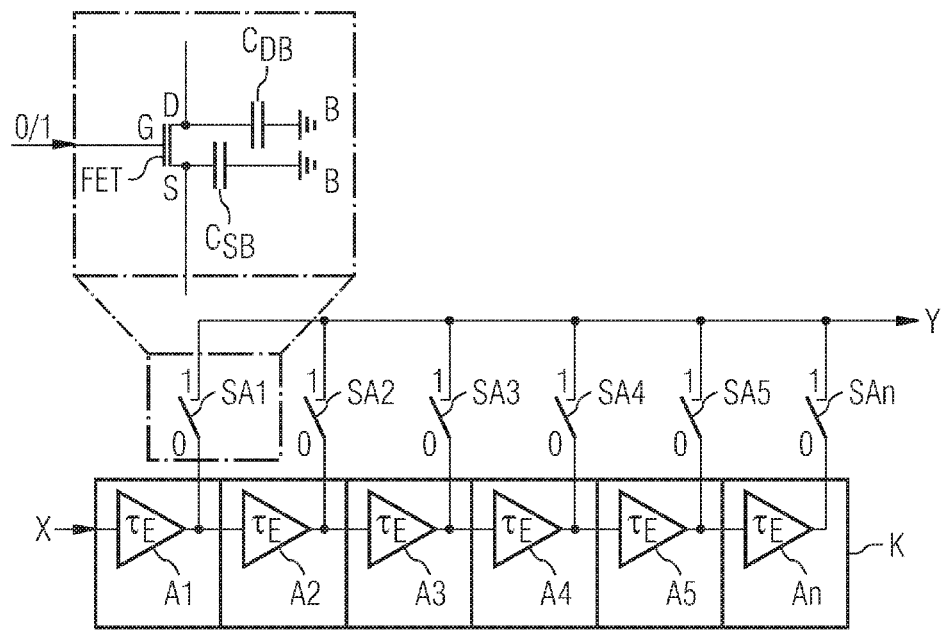
FIG. 1 shows a known delay circuit with feed multiplex and a single output.
Figure 2:
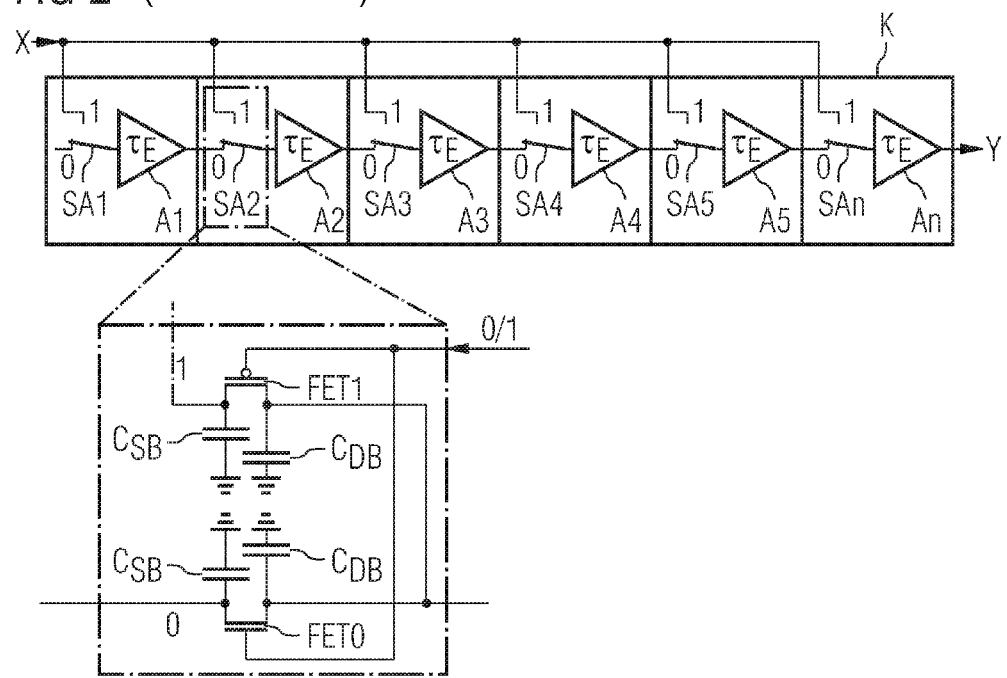
FIG. 2 shows a known delay circuit with take-off multiplex and a single output.
Figure 4:
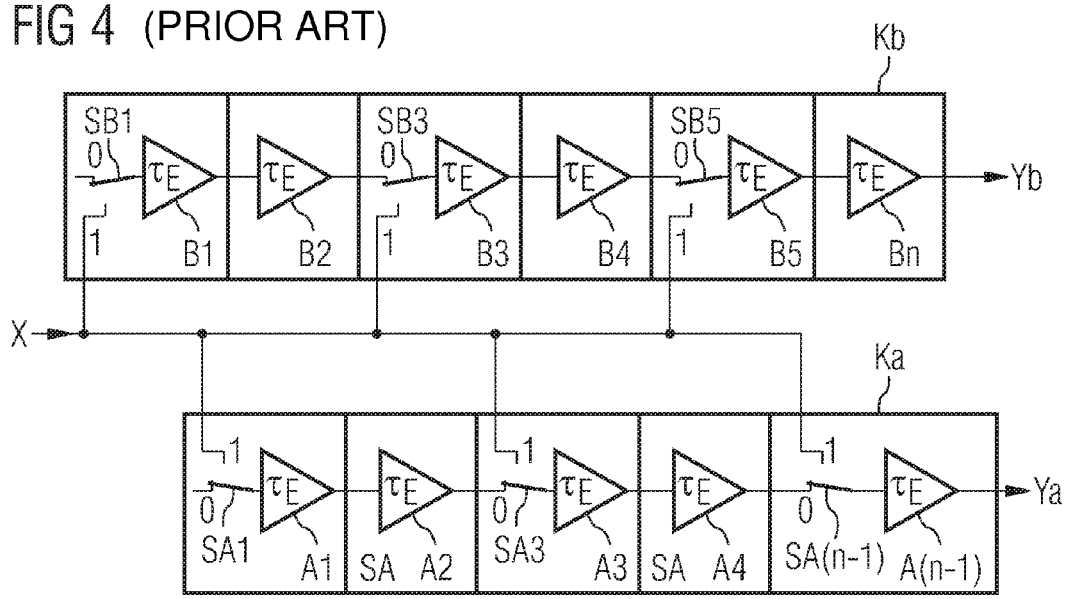
FIG. 4 shows a known delay circuit with take-off multiplex and two outputs.
Figure 5:
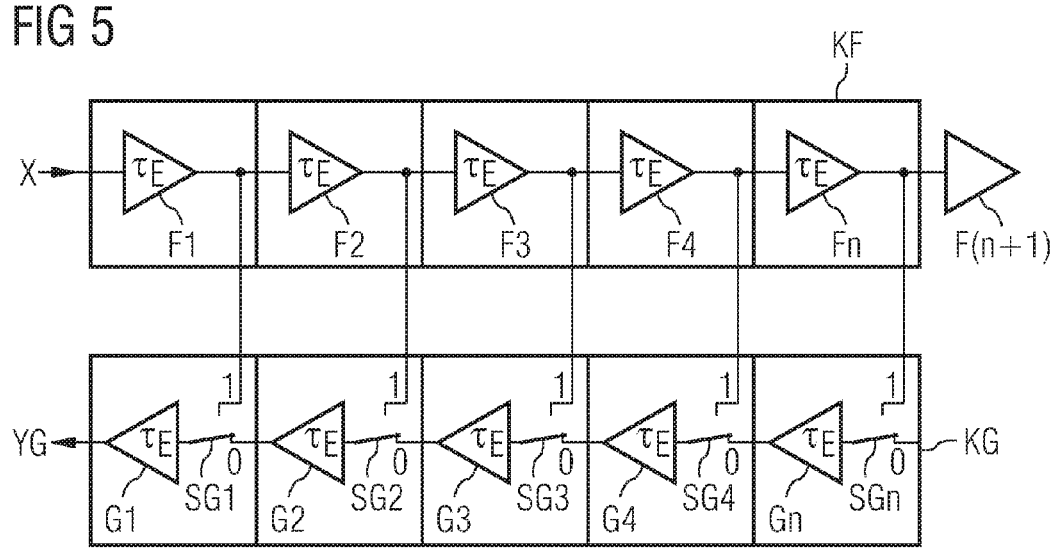
FIG. 5 shows a delay circuit according to one embodiment of the invention with a single output.
Figure 6:
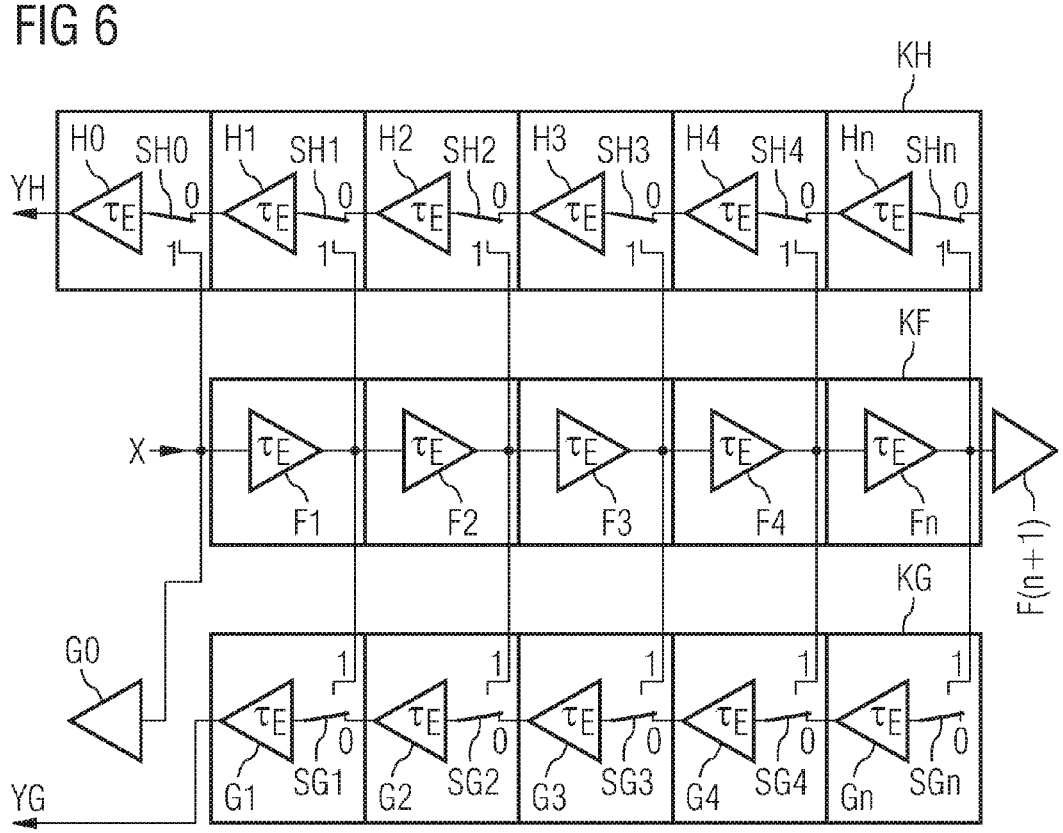
FIG. 6 shows a delay circuit according to another embodiment of the invention with two outputs for the controllable early and late delay of an input signal.

In FIGS. 5 and 6, the switches and the delay elements in the delay circuits according to embodiments of the invention are represented by the same symbols as in FIGS. 2 and 4 and are in each case also constructed in the same manner as has been described by means of FIGS. 2 and up to 4.

The circuit according to FIG. 5 contains a first delay chain KF having n successive delay elements F1 ... Fn, each of which is a bidirectional and active element having a fixed transit time $\tau_E$. In the case shown here as an example, n=5. The input of the first delay element F1 of the chain KF is connected to the circuit input X where the signal to be delayed is applied.

Furthermore, a second delay chain KG having n successive delay elements Gn ... G1 is provided, each of which is a bidirectional and active element of fixed transit time $\tau_E$. In FIG. 5 and in the text of the description following, the delay elements Gn ... G1 of the second chain KG are numbered in descending order in opposition to the ordinal numbers of their natural order, i.e., the first element is designated by Gn and the nth element is designated by G1 (accordingly, Gi designates the (n−i+1)th delay element of the chain KG). The output of the last delay element of the chain KG is connected to a circuit output YG.

In the second delay chain KG, a group of switches is provided which contains n switches SG1 ... SGn. In the exemplary embodiment shown, each switch SGi of this group is constructed as change-over switch which can be switched between two states, namely a 0 state in which it connects the input of an individually associated delay element Gi of the second chain KG to the output of the preceding delay element G(i+1) of this chain (if present), and a 1 state in which it connects the said input to the output of an individually associated delay element Fi of the first chain KF.

To set a desired delay time $\tau_{YG}$ between the circuit input X and the circuit output YG, only a single selected instance SGi of the switches SG1 . . . SGn is in each case switched into the 1 state whilst all other switches are kept in the 0 state. Formulated generally, if only the switch SGi at the input of the (n−i+1)th delay element Gi of the chain KG is in the 1 state, the signal applied at the circuit input X appears at the circuit output YG after having passed through the first i delay elements F1 . . . Fi of the first chain KF, then the switch SGi and then the last i delay elements of the second chain KG. If the transit time of the switch SGi is called $\tau_S$ and the delay time of the interconnection line to the chain KF is called $\tau_{Qi}$, the total delay is $$\tau_{YG} = 2i \cdot \tau_E + i \cdot \tau_S + \tau_{Qi}, \qquad \text{Eq. 1}$$

where i is an integral number 1 . . . n.

As can be seen from FIG. 5, the loading on the individual delay elements in the chains is much less than in the conventional art. At a maximum, each of the delay elements only "sees" two circuit elements as load. Each delay element of the first chain KF only sees the input of the next element following (if present) of this chain and the parasitic capacitance of the switch associated with its output as a load and, if this switch is in the 1 state, also the input of the delay element of the other chain KG operated via this switch. Each of the n−1 first delay elements of the second chain KG, that is to say each of the elements G2 . . . Gn, sees as a load the parasitic capacitance of the next switch following and, if this switch is in the 0 state, the input of the delay element of this chain following in each case. The last delay element G1 of the chain KG only sees the input impedance of the external load connected to the circuit output YG as a load.

The delay chains KF and KG can, therefore, be made of any length (that is they have an arbitrarily high number of stages n) without this having any influence on the loading of the individual delay elements. In one embodiment, the output of the last delay element Fn of the first chain KF is additionally connected to a further delay element F(n+1) or some other element which forms a load impedance which is equal to the input impedance of each of the delay elements in order to load the last delay element in the same manner as the other delay elements.

By arranging the two delay chains KF, KG spatially in parallel with one another and in the opposite direction of signal flow (that is to say in "antiparallel") in the manner shown, all connecting paths between the delay chains KF and KG can be set up with minimal and also identical length. The measure $\tau_{Qi}$ in the above equation Eq. 1 is thus not only minimal but also independent of which switch SG1 . . . SGn is closed. The total delay $\tau_{YG}$ is thus a linear function of the number of delay elements traversed so that no alignment effort is required for linearizing the control characteristic. The measure $\tau_{Qi}$ only becomes noticeable as an offset in the linear control characteristic. This offset can be compensated for in a simple manner by trimming the transit time of the last element G1 of the second chain KG to a value $\tau_E - \tau_{Qi}$ (as an alternative, the first element F1 of the first chain KF can also be correspondingly trimmed in the circuit according to FIG. 5).

FIG. 6 shows how the delay circuit according to FIG. 5 can be supplemented for obtaining the signal applied at the circuit input X at a second circuit output YH with a delay which is shifted by $1 \cdot (\tau_E + \tau_S)$ with respect to the version obtained at the first output YG. This supplement comprises providing a third delay chain KH having n+1 successive delay elements Hn . . . H0, each of which is associated with a switch of a second group of switches SHn . . . SH0. The delay elements Hn . . . H0 and the switches SHn . . . SH0 of the third chain KH are constructed in exactly the same manner as the delay elements and the switches in the second chain KG.

The first n delay elements Hn . . . H1 and the associated switches SHn . . . SH1 of the third chain KH form the same arrangement as the delay elements Gn . . . G1 and the switches SGn . . . SG1 of the second chain KG and are also connected to the first chain KF in the same manner. The output of the last delay element H0 of the third chain KH is connected to the second circuit output YH. The switch SH0 connects the input of the last delay element H0 to the output of the next-to-last delay element H1 when it is in the 0 state and to the circuit input X when it is in the 1 state.

To set a required delay time $\tau_{YH}$ between the circuit input X and the second circuit output YH, only a single selected instance SHi of the n+1 switches SH0 . . . SHn is in each case switched to the 1 state. If, e.g., the switch SH0 is in the 1 state, the signal applied at the circuit input X only passes through a single delay element up to the second circuit output YH, namely only the last element H0 of the third chain KH. If the switch SH1 to the input of the next-to-last delay element H1 is in the 1 state, three delay elements are traversed, namely the first delay element F1 of the first chain KF and the last two delay elements H1 and H0 of the third chain KH. Put generally, if the switch SHi to the input of the delay element Hi of the chain KH is in the 1 state, the signal applied at the circuit input X appears at the circuit output YH with a delay (2i+1) $\cdot (\tau_E + \tau_S)$, $\tau_S$ being the transit time of an individual switch. If the delay time of the connecting line leading via a switch SHi between the chains KF and KH is designated by $\tau_{Qi}$, the total delay is $$\tau_{YH} = (2i+1) \cdot \tau_E + (i+1) \cdot \tau_S + \tau_{Qi}, \qquad \text{Eq. 2}$$

where i is an integral number 0 . . . n. Similar to as described above by means of FIG. 5, the measure $\tau_{Qi}$ can also be kept minimal and independent of the switch selection in this case and the offset caused by $\tau_{Qi}$ can be compensated for by correspondingly trimming the last delay element H0 of the third chain KH.

Using the delay circuit according to FIG. 6, it is possible, therefore, to obtain at the output YH a total delay which is an arbitrary odd-numbered multiple of $\tau_E + \tau_S$ by switching an arbitrary instance SHi of the n+1 switches SH0 . . . SHn into the 1 state. At the same time, it is possible to obtain at the other output YG a total delay which is an arbitrary even-numbered multiple of $\tau_E + \tau_S$ by switching an arbitrary instance SGi of the n switches SG1 . . . n into the 1 state.

As has already been indicated above, this can be utilized for obtaining two versions from a clock signal applied at the input end, namely an early version controllable in uniform step length $\tau_E + \tau_S$ and a late version delayed by an additional step $\tau_E + \tau_S$ by comparison. If the delay of the early version is to be an odd-numbered multiple 2i+1 of $\tau_E + \tau_S$, the switches SHi and SG(i+1) are switched into the 1 state and the early version is taken off at the output YH whereas the late version is taken off at the output YG. If the delay of the early version is to be an even-numbered multiple of $\tau_E + \tau_S$, the switches SHi and SGi are switched into the 1 state and the early version is taken off at the output YG whereas the late version is taken off at the output YH.

On the other hand, the delay circuit according to FIG. 6 can also be utilized for obtaining a single output signal, the delay of which is controllable in uniform step length $\tau_E+\tau_S$. For this purpose, it is only necessary to connect the two outputs YG and YH with one another and, for setting the desired delay time, to close only a single switch either of the group of switches SG1 . . . SGn or of the group of switches SH0 . . . SHn.

Figure 3:
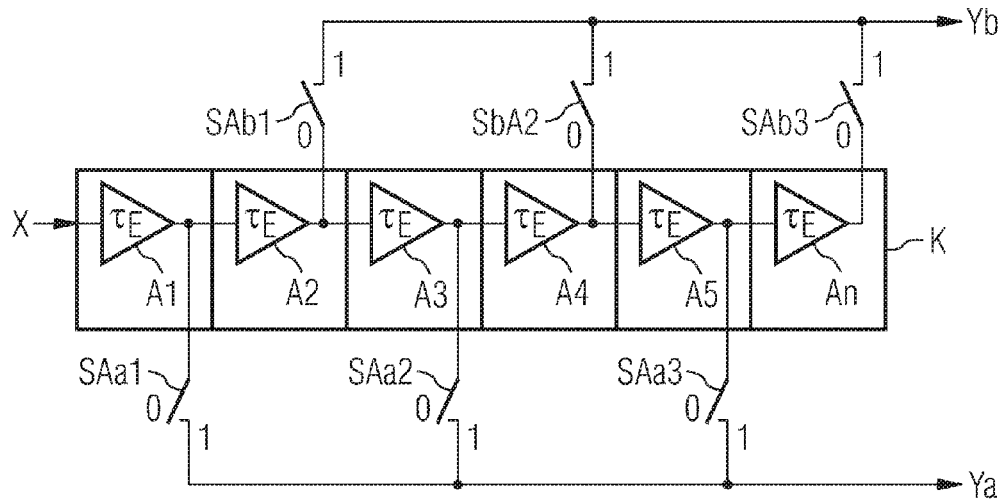
FIG. 3 shows a known delay circuit with feed multiplex and two outputs.

In the delay circuit according to FIG. 6, the dynamic loading on the individual delay elements in the chains is also much less than in the conventional art according to FIG. 3 or FIG. 4. The maximum loading on each delay element is independent of the total length of the delay circuit. Each delay element Fi of the chain KF always only needs to drive three load impedances, namely the input impedance of the following delay element F(i+1) of this chain and two further loads, each of which is the impedance of the parasitic capacitance of a switch and, if the switch is in the 1 state, additionally also the input impedance, seen via the switch, of a delay element of one of the other chains. In one embodiment, an additional delay element G0, or some other element which forms a load impedance which is equal to the input impedance of each of the delay elements, is connected to the circuit input X in order to load a driver (not shown) for the circuit input in the same manner as the individual delay elements of the chain KF.

Each of the first to next-to-last delay elements of the other chains KG and KF always only needs to drive one load impedance which contains the parasitic capacitance of a switch and, if the switch is in the 0 state, the input impedance of the following delay element of the relevant chain. The last delay elements G1 and H0 of the chains KG and KH are only loaded by the external load (not shown) connected in each case.

The control signals (0/1) for the individual switches in the circuit arrangements according to FIGS. 5 and 6 can be generated by a control device and applied to the control connections of the switches via associated control lines. The control device and the control lines for the switches are not separately shown in the figures.

The circuit arrangements described above by means of FIGS. 5 and 6 are only examples and can be modified in various ways within the context of the concept of the invention. Thus, the successive delay elements in the chains KG and KH can also be connected directly to one another and, instead of the change-over switches shown (2:1 multiplexers), simple line switches can be inserted in the interconnections between the chains. To produce a connection between the output of a selected delay element Fi of the first chain KF and the input of a delay element Gi or Hi, respectively, of another chain KG or KH, respectively, the relevant switch is closed. The control signal generated for this purpose can also be used at the same time for deactivating in the relevant other chain KG or KH, respectively, the output of the delay element G(i−1) or H(i−1), respectively, which precedes the connection established by the closed switch. Such deactivation can be made possible by correspondingly constructing the delay elements, e.g., by using a tristate output.

If desired, an additional and selectively controllable switch (not shown) can be provided in the first chain KF before each delay element Fi in order to interrupt the signal flow to this element (and thus to all subsequent elements of the chain KF) if the immediately preceding tap of this chain is connected to the other chain (or the other chains). This leads to operating current being saved.

Using two delay chains in accordance with the invention makes it possible to insert an arbitrary number of pairs of the delay elements in series between the circuit input and a circuit output by selectively controlling the existing switches, the loading on each element and also the total load at the circuit input remaining low and being independent of the length of the delay chains. The chains can thus be made of any length without load problems arising.

By adding a third delay chain with associated switches, it is thus possible in a simple manner to obtain a controllably delayed early version and a version delayed by a fixed time scale by comparison of the signal applied at the circuit input. In this arrangement, only 3n/2 delay elements are needed for an n-stage control range of the delay.

While the foregoing is directed to embodiments of the present invention, other and further embodiments of the invention may be devised without departing from the basic scope thereof, and the scope thereof is determined by the claims that follow.

What is claimed is:

1. A circuit arrangement for controllably delaying electrical signals between a circuit input and at least one circuit output, comprising:

a first delay chain having n series-connected delay elements, each of which comprising an active circuit with a fixed transit time, wherein an input of a first delay element is connected to the circuit input, wherein an output of each delay element is selectively connectable to a forwarding circuit leading to a first circuit output via a respectively associated switch of a first group of switches, wherein the forwarding circuit has a second delay chain leading to the first circuit output, the second delay chain comprising n series-connected delay elements, each of which comprising an active circuit with a fixed transit time, and wherein the output of each delay element of the first delay chain is selectively connectable to a respective input of the (n−i+1)th delay element of the second delay chain via the respectively associated switch of the first group of switches, wherein i=1 . . . n is defined as an ordinal number of the delay elements of the first delay chain, wherein the forwarding circuit has a third delay chain, leading to a second circuit output, with n +1 series-connected delay elements, each of which comprising an active circuit with a fixed transit time, wherein an input of a last delay element of the third delay chain is connectable to the circuit input via an associated switch of a second group of switches, and wherein the output of each delay element of the first delay chain is selectively connectable to a respective input of the (n−i+1)th delay element of the third delay chain via a respectively associated other switch of the second group of switches.

2. The circuit arrangement as claimed in claim 1, wherein the circuit input is connected to an additional load impedance which is equal to an input impedance of each delay element of the delay chains.

3. The circuit arrangement as claimed in claim 2, wherein the additional load impedance comprises a further delay element which is substantially identical with the delay elements of the delay chains.

4. The circuit arrangement as claimed in claim 1, wherein an output of the last delay element of the first delay chain is connected to an additional load impedance which is equal to the input impedance of each delay element of the delay chains.

5. The circuit arrangement as claimed in claim 4, wherein the additional load impedance comprises a further delay element which is substantially identical with the delay elements of the delay chains.

6. The circuit arrangement as claimed in claim 1, wherein a spatially parallel arrangement, an orientation of the delay chains relative to one another, and line runs between the delay chains are arranged such that all connections between the delay chains span about the same spatial distance and have about the same line length.

7. The circuit arrangement as claimed in claim 1, wherein all connections between the delay chains have about the same transit time $\tau_Q$.

8. The circuit arrangement as claimed in claim 7, wherein all delay elements of the first delay chain and all delay elements except the respective last delay element of each delay chain of the forwarding circuit have about the same transit time $\tau_E$, and wherein the transit time of the respective last delay element of each delay chain of the forwarding circuit is equal to $\tau_E - \tau_{Qi}$, wherein $\tau_{Qi}$ is a transit time between a respective connection between the delay chains.

9. The circuit arrangement as claimed in claim 1, wherein all delay elements of the delay chains have about the same transit time $\tau_E$.

10. A system, comprising the circuit arrangement of claim 1 and a plurality of electrical components, the plurality of electrical components being at least one of structurally and functionally related.

11. The system of claim 10, wherein at least one of the plurality of electrical components is a delay-locked loop (DLL).

12. A circuit arrangement for controllably delaying electrical signals between a circuit input and a first and a second circuit output, comprising:
   a first delay chain having n series-connected delay elements;
   a second delay chain having n series-connected delay elements;
   a third delay chain having n+1 series-connected delay elements;
   wherein each of the delay elements of the first, second and third delay chains comprises an active circuit with a fixed transit time and has an input and an output,
   wherein an input of a first delay element of the first delay chain is connected to the circuit input,
   wherein an output of an n-th delay element of the second delay chain is connected to the first circuit output,
   wherein an output of an (n+1)-th delay element of the third delay chain is connected to the second circuit output,
   wherein an output of an i-th delay element of the first delay chain is selectively connected to an input of an (n−i+1)-th delay element of the second delay chain via a respectively associated switch of a first group of switches,
   wherein the output of the i-th delay element of the first delay chain is selectively connected to an input of an (n−i+1)-th delay element of the third delay chain via a respectively associated switch of a second group of switches,
   wherein an input of the (n+1)-th delay element of the third delay chain is connected to the circuit input via an associated switch of the second group of switches,
   wherein i=1 . . . n is defined as an ordinal number of the delay elements of the first, second and third delay chains.

13. The circuit arrangement as claimed in claim 12, wherein the circuit input is connected to an additional load impedance which is equal to the input impedance of each delay element of the delay chains.

14. The circuit arrangement as claimed in claim 13, wherein the additional load impedance comprises a further delay element which is substantially identical with the delay elements of the delay chains.

15. The circuit arrangement as claimed in claim 12, wherein a spatially parallel arrangement, an orientation of the delay chains relative to one another, and line runs between the delay chains, are arranged such that all connections between the delay chains span about the same spatial distance and have about the same line length.

16. The circuit arrangement as claimed in claim 12, wherein all connections between the delay chains have about the same transit time $\tau_Q$.

17. The circuit arrangement as claimed in claim 12, wherein all delay elements of the delay chains have about the same transit time $\tau_E$.

18. The circuit arrangement as claimed in claim 12, wherein all delay elements of the first delay chain and all delay elements except the respective last delay element of each delay chain of the forwarding circuit have about the same transit time $\tau_E$, and wherein the transit time of the respective last delay element of each delay chain of the forwarding circuit is equal to $\tau_E - \tau_{Qi}$, wherein $\tau_{Qi}$ is a transit time between a respective connection between the delay chains.

19. A system, comprising arrangement of claim 12 and a plurality of electrical components, the plurality of electrical components being at least one of structurally and functionally related.

20. The system of claim 19, wherein at least one of the plurality of electrical components is a delay-locked loop (DLL).

21. A controllable delay circuit, comprising:
   a first delay chain having a signal input, the first delay chain comprising a first plurality of series-connected delay elements, each delay element having an output tap;
   a second delay chain having a signal output, the second delay chain comprising a second plurality of series-connected delay elements and a corresponding plurality of switches connected to a respective input of each delay element of the second delay chain, wherein each switch is controllably switched to connect to one of an output of the delay elements in the first delay chain in reverse order and an output of a preceding delay element of the second delay chain, if present; and
   a third delay chain having a second signal output, the third delay chain comprising a third plurality of series-connected delay elements and a corresponding plurality of switches connected to a respective input of each delay element of the third delay chain, wherein each switch is controllably switched to connect to one of an output of the delay elements in the first delay chain in reverse order and an output of preceding delay element of the third delay chain, if present, wherein the third delay chain comprises one additional delay element than the second delay chain, wherein the one additional delay element is switchably connected between an output of preceding delay element of the third delay chain and the signal input, and wherein the one additional delay element is connected to provide the second signal output.

22. The controllable delay circuit of claim 21, further comprising:
   a first additional load impedance connected to the signal input; and
   a second additional load impedance connected to an output of a last delay element of the first delay chain;
   wherein each additional load impedance comprises a further delay element which is substantially identical with the delay elements of the delay chains.

23. A system, comprising the controllable delay circuit of claim 21 and a plurality of electrical components, the plurality of electrical components being at least one of structurally and functionally related.

24. The system of claim 23, wherein at least one of the plurality of electrical components is a delay-locked loop (DLL).

* * * * *